United States Patent
Furukawa et al.

(10) Patent No.: US 7,264,415 B2
(45) Date of Patent: Sep. 4, 2007

(54) METHODS OF FORMING ALTERNATING PHASE SHIFT MASKS HAVING IMPROVED PHASE-SHIFT TOLERANCE

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 566 days.

(21) Appl. No.: 10/798,908

(22) Filed: Mar. 11, 2004

(65) Prior Publication Data
US 2005/0202322 A1 Sep. 15, 2005

(51) Int. Cl.
G03F 1/00 (2006.01)
G03C 5/00 (2006.01)
(52) U.S. Cl. .......................... 403/5; 430/394
(58) Field of Classification Search .............. 430/5, 430/394; 716/19–21
See application file for complete search history.

(56) References Cited

U.S. PATENT DOCUMENTS

| | | | |
|---|---|---|---|
| 5,194,346 A | 3/1993 | Rolfson et al. | |
| 5,773,171 A | 6/1998 | Lee et al. | |
| 6,048,652 A * | 4/2000 | Nguyen et al. | 430/5 |
| 6,187,480 B1 | 2/2001 | Huang | |
| 6,376,130 B1 | 4/2002 | Stanton | |
| 6,660,653 B1 | 12/2003 | Tzu et al. | |
| 2002/0195673 A1* | 12/2002 | Chou et al. | 257/414 |
| 2005/0158634 A1* | 7/2005 | Thony et al. | 430/5 |

OTHER PUBLICATIONS

P. F. Garcia et al., "Thin Films for Phase-Shift Masks," published in Vacuum and Thin Film, IHS Publishing Gorup, 14-21, Sep. 1999.

* cited by examiner

*Primary Examiner*—S. Rosasco
(74) *Attorney, Agent, or Firm*—Wood, Herron & Evans, LLP

(57) ABSTRACT

Methods for fabricating alternating phase shift masks or reticles used in semiconductor optical lithography systems. The methods generally include forming a layer of phase shift mask material on a handle substrate and patterning the layer to define recessed phase shift windows. The patterned layer is transferred from the handle wafer to a mask blank. The depth of the phase shift windows is determined by the thickness of the layer of phase shift mask material and is independent of the patterning process. In particular, the depth of the phase shift windows is not dependent upon the etch rate uniformity of an etch process across a surface of a mask blank.

48 Claims, 7 Drawing Sheets

METHODS OF FORMING ALTERNATING PHASE SHIFT MASKS HAVING IMPROVED PHASE-SHIFT TOLERANCE

FIELD OF THE INVENTION

The invention relates to semiconductor device fabrication and, more particularly, to the manufacture of alternating phase shift masks and reticles for resolution enhancement in optical lithography systems used in the fabrication of integrated circuit devices.

BACKGROUND OF THE INVENTION

As feature sizes and pitches shrink in the fabrication of integrated circuit devices, the resolution of the projection optics in conventional optical lithography systems begins to limit the quality of photoresist images created on wafers using binary photomasks that only modulate the intensity of the projected electromagnetic radiation. Specifically, electromagnetic radiation from a light source of the optical lithography system is completely blocked by the opaque features in the binary mask and is fully transmitted through transparent mask regions. Alternating phase shift masks (altPSM's) represent a powerful resolution enhancement technique (RET) that can effectively increase the resolution of conventional optical lithography systems by introducing a 180° or half-wavelength phase shift in the light transmitted between neighboring windows of the mask. This phase shifting is accomplished by creating a path length difference for the exposing electromagnetic radiation in the mask material between adjacent windows on the phase shift mask. Features are formed in exposed resist by the diffraction edges due to destructive interference. Hence, altPSM's not only modulate the intensity of the transmitted electromagnetic radiation, but its phase as well.

The optical path length difference is created by recessing phase shift windows in a blank of the transparent mask material to a depth proportional to the source wavelength and inversely proportional to the refractive index of the mask material. The mask blank is typically fabricated by patterning a layer of an opaque material deposited on the mask blank and then providing recessed phase shift windows in the unmasked areas of the patterned opaque layer by reactive ion etching (RIE). The fabrication of altPSM's is limited by the uniformity of the etch process. Specifically, the mask blank lacks an etch stop layer so that the inherent pattern factor and across-wafer substrate spatial variations of the etch rate in the RIE process chamber are reproduced in the mask blank. The variations in etch depth arising from the etch rate variations degrade depth of focus and effectively reduce resolution in the finished altPSM as the phase shift windows have different depths in different regions of the altPSM.

What is needed, therefore, is a method of fabricating an alternating phase shift mask that forms phase shift windows without directly etching a mask blank.

SUMMARY OF THE INVENTION

In accordance with the principles of the invention, a method of fabricating an alternating phase shift mask includes forming a layer of a phase shift mask material on a handle substrate and patterning the layer to form a plurality of phase shift windows in the phase shift mask material. The patterned layer is transferred from the handle substrate to a mask blank to construct the alternating phase shift mask.

The alternating phase shift mask of the invention is not directly etched in a mask blank but, instead, is assembled by bonding a pre-fabricated mask layer with uniformly deep phase shift windows and formed on a handle substrate to a mask blank. The thickness uniformity of semiconductor growth and deposition processes defining the depth of the phase shift windows is significantly greater than the depth uniformity of etch processes. By eliminating etching of the mask blank, the uniformity of the depth of the phase shift windows over the entire surface area of the alternating phase shift mask is significantly improved. As a result, a phase shift mask may be fabricated according to the principles of the invention in a reproducible and repeatable fashion as deposition processes and growth processes, such as oxidation, used to fabricate the phase shift mask of the invention are capable of better or tighter thickness control than etch processes currently used to fabricate conventional alternating phase shift masks. If silicon wafers are employed as handle substrates, then standard well-known and well-controlled silicon semiconductor fabrication techniques can be employed both to construct the patterned phase shift layer and to transfer the layer to the a mask blank. The phase shift windows of the invention are formed by etching completely through the layer of phase shift mask material and into the underlying handle wafer. Because the phase shift mask is transferred from the handle wafer to the mask blank, over-etching of the phase shift windows into the underlying handle wafer is immaterial as the thickness of the layer of phase shift material is determinative of the depth of the phase shift windows.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention is directed to a process for making an alternating phase shift mask having recessed phase shift windows of a substantially uniform depth. The phase shift mask may incorporate a pattern large enough to pattern an entire wafer at one time or, alternatively, may function as a reticle containing a pattern for one or more die but not large enough to transfer a wafer-sized pattern in a single exposure. Such reticles are employed in conjunction with conventional stepping optical lithography systems or steppers employed for most sub-micron pattern exposures. Typically a reticle used in stepping optical lithography has a 4× reduction factor. The alternating phase shift masks of the invention are fabricated without introducing variations in the depth of the phase shift windows associated with etching processes.

Figure 1A:
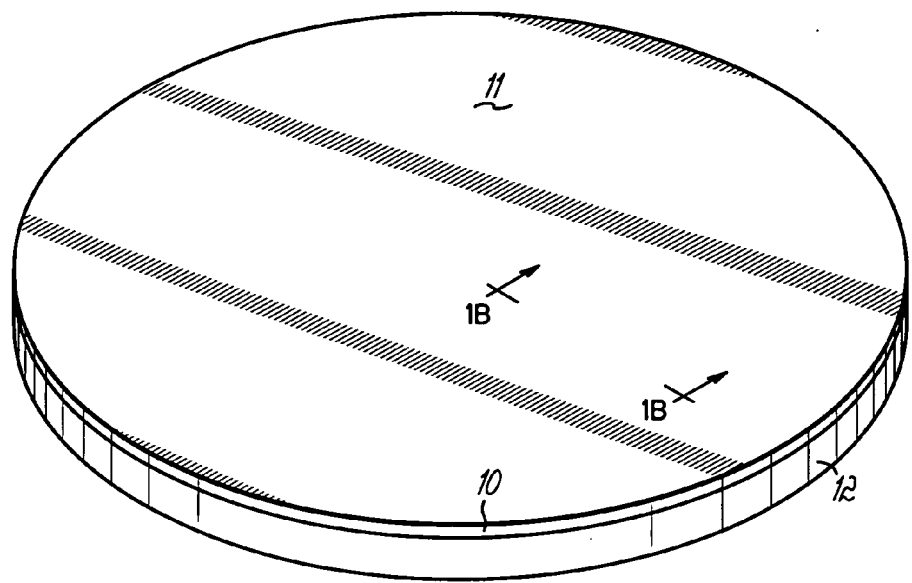
FIG. 1A is perspective view of a substrate.
Figure 1B:
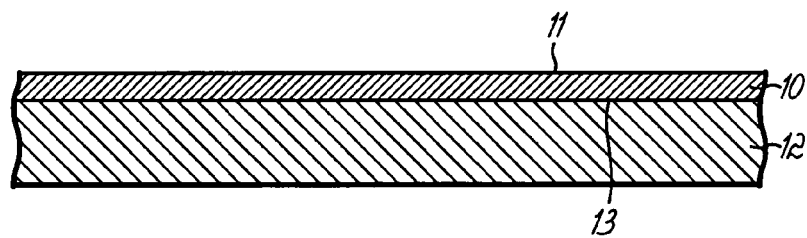
FIG. 1B is a cross-sectional view of a portion of the substrate of FIG. 1A taken generally along lines 1B-1B in FIG. 1A.

With reference to FIGS. 1A and 1B, a mask material layer 10 characterized by a thickness between opposite surfaces 11 and 13 proportional to a source wavelength of the intended optical lithography process and inversely proportional to the refractive index of the constituent mask material is formed on a handle substrate 12. Surface 13 defines an interface with the handle substrate 12. Mask material layer 10 is any optically transparent or translucent material suitable for forming an alternating phase shift mask. Handle substrate 12 may be any composed of any material characterized by adequate flatness, low surface roughness, and suitable stability at process temperatures. In one embodiment, the mask material layer 10 is quartz or silicon oxide either grown by thermal oxidation or deposited by chemical vapor deposition on a handle substrate 12 being a silicon or polycrystalline silicon (polysilicon) wafer.

References herein to terms such as "vertical", "horizontal", etc. are made by way of example, and not by way of limitation, to establish a frame of reference. The term "horizontal" as used herein is defined as a plane parallel to the conventional plane or surface of handle substrate 12, regardless of its orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed without departing from the spirit and scope of the invention.

Figure 2A:
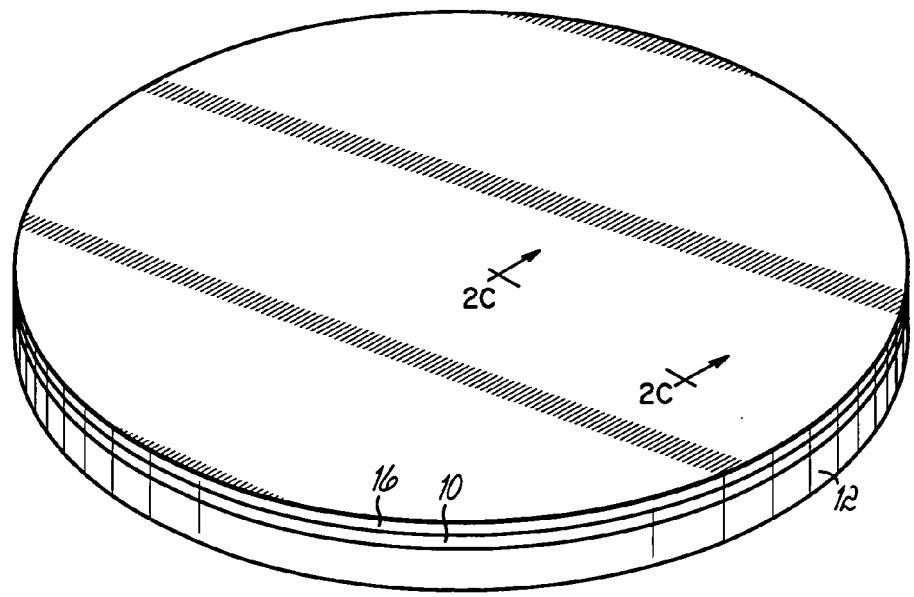
FIG. 2A is a perspective view similar to FIG. 1A at a subsequent fabrication stage.
Figure 2B:
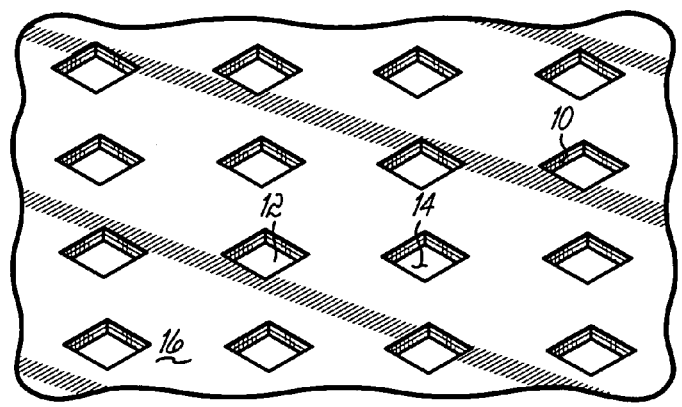
FIG. 2B is an enlarged view of a portion of FIG. 2A.
Figure 2C:
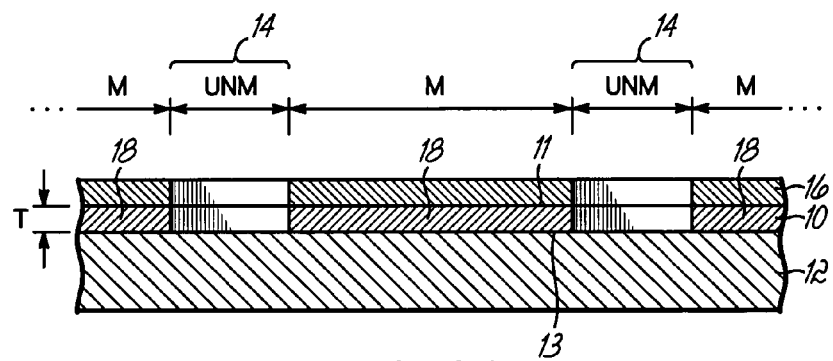
FIG. 2C is a cross-sectional view of a portion of the substrate of FIG. 2A taken generally along lines 2C-2C in FIG. 2A.

With reference to FIGS. 2A-2C in which like reference numerals refer to like features in FIGS. 1A and 1B and in a subsequent fabrication step, the mask material layer 10 is patterned using standard lithographic and subtractive etch process. The lithographic process entails applying a radiation-sensitive resist layer 16 to the mask material layer 10, exposing through a conventional photomask to impart a latent projected image pattern in the resist layer 16 characteristic of the intended recessed phase shift windows 14, and developing the resist layer 16 to transform the latent image pattern into a final image pattern that defines masked areas, M, and unmasked areas, UNM, correlated with the prospective locations of the phase shift windows 14. Mask material of layer 10 in unmasked areas is subsequently removed by any suitable etching process, such as anisotropic etching (e.g. plasma etching or reactive ion etching), capable of producing vertical sidewalls to permanently define the phase shift windows 14 in mask material layer 10. Mask material in layer 10 protected by the overlying masked areas is unaffected by the anisotropic etch process.

After the phase shift windows 14 are defined by the anisotropic etch process, the resist layer 16 is stripped from the patterned mask material layer 10. The thickness, T, of the mask material layer 10 between surfaces 11 and 13 determines the depth of the recessed phase shift windows 14, which is independent of any spatial non-uniformities across the surface of handle substrate 12 during the etch process. In particular, over-etching in the unmasked areas past the interface between surface 13 and the handle substrate 12 into the bulk of handle substrate 12 does not affect the depth of the recessed phase shift windows 14 as the depth is determined exclusively by the thickness of the mask material layer 10.

With continued reference to FIGS. 2A-2C, regions of the mask material layer 10 masked by the masked areas of resist layer 16 during etching define non-phase shift windows 18 adjacent to the phase shift windows 14. The non-phase shift windows 18 have a thickness equal to the thickness, T, of mask material layer 10 between opposite surfaces 11 and 13. In the illustrated embodiment, each of the phase shift windows 14 is bounded on all sides by non-phase shift windows 18, although the invention is not so limited.

Although the phase shift windows 14 are illustrated as an array of contact holes, the invention is not so limited as other types of repetitive or non-repetitive features may be formed in resist layer 16. The phase shift windows 14 are not visible in FIG. 2A due to the disparity in dimensions between windows 14 and handle substrate 12. It is understood by persons of ordinary skill in the art that the dimensions of the phase shift windows 14 and the thicknesses of layer 10 and handle substrate 12 are not limiting or to scale in the drawings and are selected for purposes of illustration only.

Figure 3A:
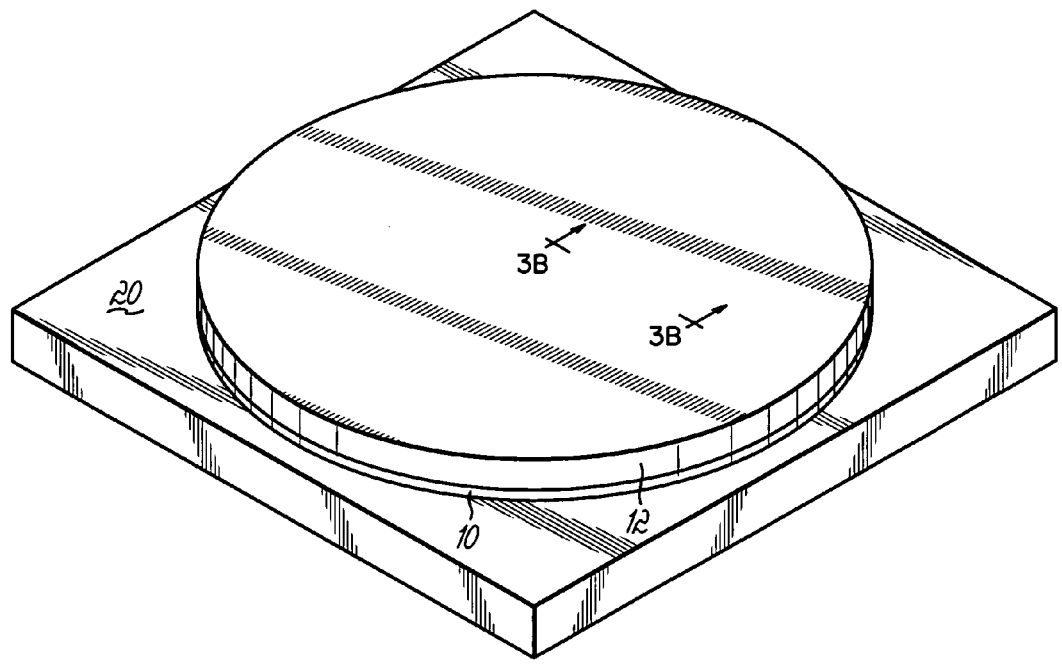
FIG. 3A is a perspective view similar to FIG. 2A at a subsequent fabrication stage.
Figure 3B:
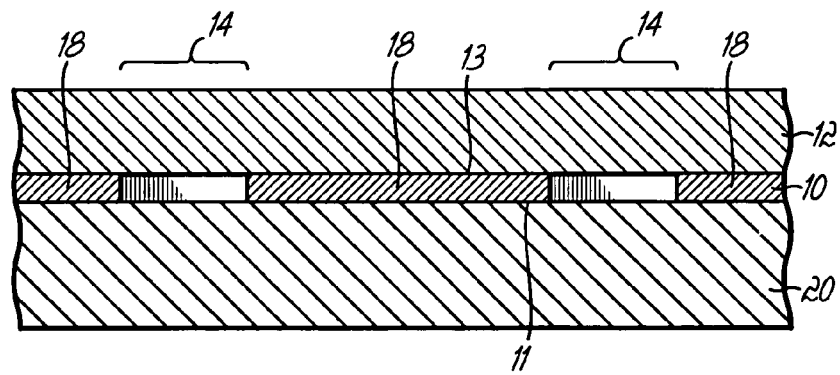
FIG. 3B is a cross-sectional view of a portion of the substrate of FIG. 3A taken generally along lines 3B-3B in FIG. 3A.

With reference to FIGS. 3A and 3B in which like reference numerals refer to like features in FIGS. 2A and 2B and in a subsequent fabrication step, the patterned mask material layer 10 and handle substrate 12 are bonded to a standard mask blank 20 with surface 13 of the patterned mask material layer 10 contacting the mask blank 20. For example, silicon-on-insulator bonding techniques may be used to bond an oxide or quartz mask material to a quartz mask blank 20. In one embodiment, the patterned mask material layer 10 and handle substrate 12 are contacted, placed in a suitable atmosphere, and then directly bonded by subjecting their coextensive interface to heat sufficient to produce an interface temperature greater than about 200° C. and for a time sufficient to achieve fusion bonding at the interface between surface 13 and the confronting surface 21 of mask blank 20. The patterned mask material layer 10 and the mask blank 20 have similar or identical optical properties. The transfer of the patterned mask material layer 10 to the mask blank 20 is accomplished without introducing errors in the depth of the recessed phase shift windows 14. The mask blank 20 may be any optically transparent or translucent material, such as quartz, suitable for forming an alternating phase shift mask.

Figure 3C:
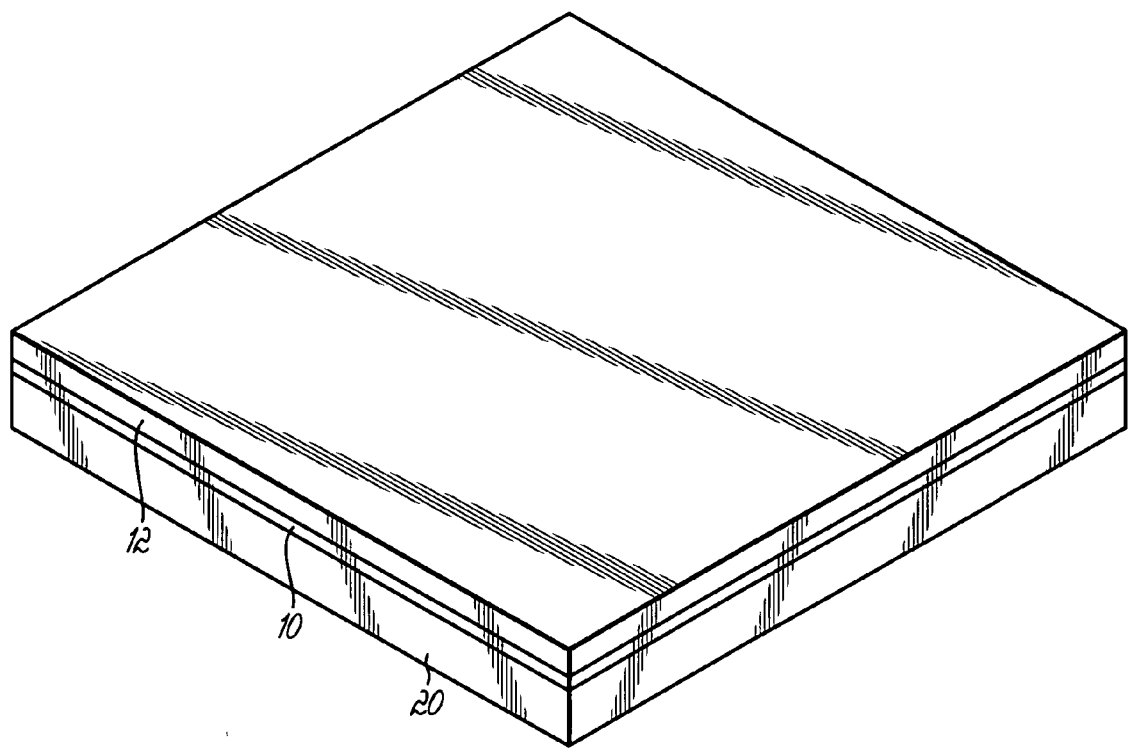
FIG. 3C is a perspective view similar to FIG. 3A in accordance with an alternative embodiment of the invention.

Before being bonded to the mask blank 20, the handle substrate 12 may be optionally cleaved or diced to a final dimension, as depicted in FIG. 3C. This could be accomplished by forming a space around the desired expose field to divide the patterned mask material layer 10 into smaller sections. For example, the patterned mask material layer 10 may be sectioned into, for example, a 150 square millimeter sections of mask material if handle substrate 12 is a 300 millimeter silicon wafer. This area of reduced dimensions is bonded to the mask blank 20. It follows that, because phase shift mask 22 (FIGS. 4A and 4B) is typically smaller in dimensions than the handle substrate 12, the thickness of the mask material layer 10 merely needs to be uniform over the region of the surface area of handle substrate 12 containing the recessed phase shift windows 14 and that multiple phase shift masks 22 may be fabricated on a single handle substrate 12.

Figure 4A:
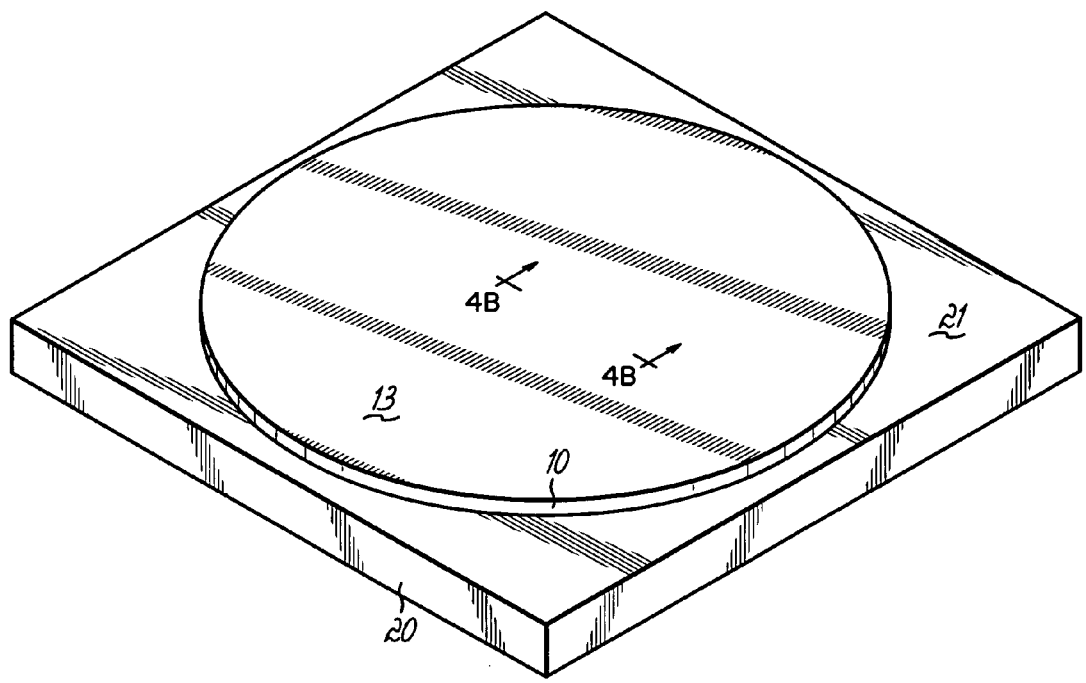
FIG. 4A is a perspective view similar to FIG. 3A at a subsequent fabrication stage.
Figure 4B:
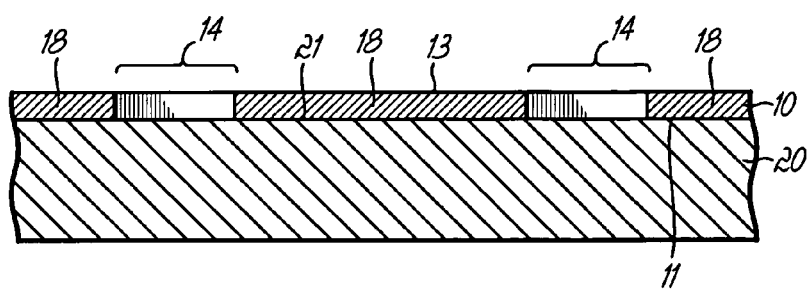
FIG. 4B is a cross-sectional view of a portion of the substrate of FIG. 4A taken generally along lines 4B-4B in FIG. 4A.

With reference to FIGS. 4A and 4B in which like reference numerals refer to like features in FIGS. 3A and 3B and in a subsequent fabrication step, the handle substrate 12 is removed so that the patterned mask material layer 10 is freed from the handle substrate 12 and supported by the mask blank 20 to form the phase shift mask 22. The removal process is selected so that the mask material of layer 10 is unaffected. For example, a silicon handle substrate 12 may be removed by using an etching technique, such as a wet etch in an aqueous potassium hydroxide (KOH) solution or an aqueous solution containing KOH and alcohol, that is selective such that the silicon characterizing the handle substrate 12 is etched but the patterned oxide or quartz mask material layer 10 is not significantly etched. Alternatively, handle substrate 12 may be removed by cleaving. The silicon handle substrate 12 may be thinned by a non-etch technique before etching for purposes of reducing the etch time. The interface between the patterned mask material layer 10 and the mask blank 20 is smoothly continuous after bonding so that the interface is substantially free of refractive index effects.

Figure 5A:
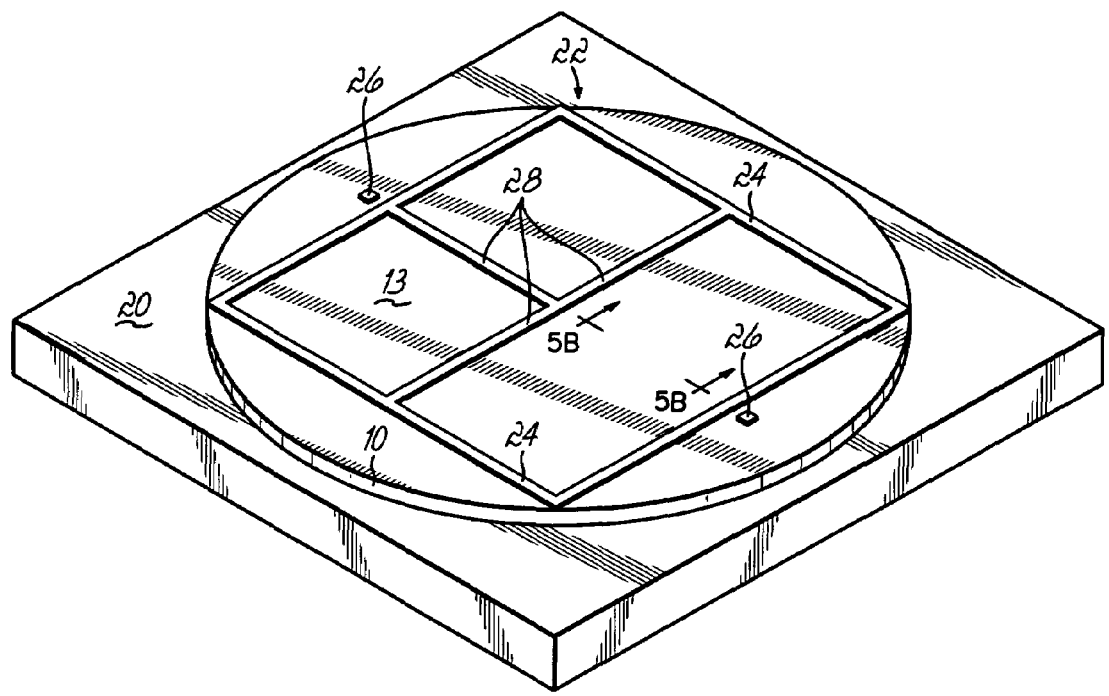
FIG. 5A is a perspective view similar to FIG. 4A at a subsequent fabrication stage.
Figure 5B:
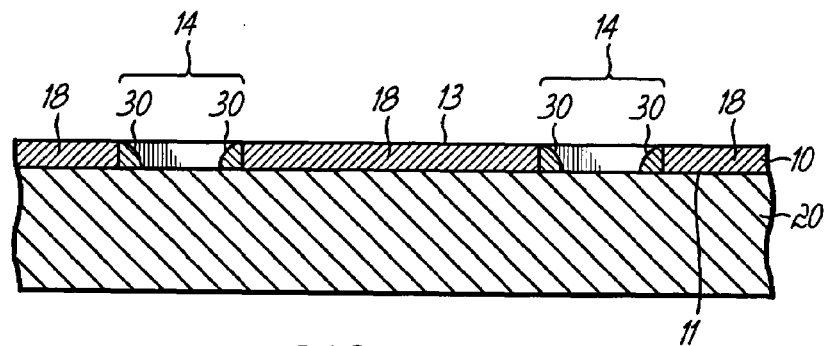
FIG. 5B is a cross-sectional view of a portion of the substrate of FIG. 5A taken generally along lines 5B-5B in FIG. 5A.

With reference to FIGS. 5A and 5B in which like reference numerals refer to like features in FIGS. 4A and 4B and in a subsequent fabrication step, non-transmissive or opaque mask features 24, 26, 28, 30 of an optically opaque material, such as chromium, aluminum, gold, tungsten, or silicon, may be optionally added to the phase shift mask 22. The opaque features 24, 26, 28, 30 effectively define a binary mask overlaid with the phase shift windows 14 and non-phase shift windows 18 that blocks the transmission of electromagnetic radiation through the corresponding opaque areas of the phase shift mask 22. Alternatively, the opaque mask features 24, 26, 28, 30 may be structures formed on, or in, the surface of the phase shift mask 22 that reflect or diffuse electromagnetic radiation, so that the electromagnetic radiation projected on any opaque mask feature 24, 26, 28, 30 does not produce a threshold exposure in the resist underlying that feature on the wafer.

Common opaque mask features 24, 26, 28, 30 include, but are not limited to, a border 24 surrounding the exposure field, alignment marks 26, features 28 for forming wider patterns on the wafer inappropriate for formation by phase shifted electromagnetic radiation, and a sidewall spacer 30 about the periphery of each phase shift window 14. The border 24 separates adjacent fields when printing using a conventional optical lithography system and defines a location for placement of the alignment marks 26 for the expose tool of the optical lithography system. Typically, wider pattern features 28 are formed on the wafer than can be directly supported by the alternating phase shift patterns supplied by the recessed phase shift windows 14. In some types of phase shift patterns, the sidewall spacers 30 enhance the aerial image from the phase shift mask 22, which allows a better depth of focus to be achieved for the phase shift pattern projected onto the wafer.

The opaque mask features 24, 26, and 28 may be formed by any method apparent to persons of ordinary skill in the art. In one embodiment of the invention, a blanket layer of the opaque mask material is deposited over the patterned mask material layer 10 and exposed areas of the side of the mask blank 20 to which the patterned phase mask material layer 10 is bonded. Typically, the blanket layer is constituted by a layer of chrome approximately 30 nanometers (nm) to 80 nm thick. Resist is applied and a conventional mask write lithographic process is used to pattern the resist such that the appropriate border 24, alignment marks 26, and features 28 for forming wider pattern features are formed. The resist is developed and the blanket layer is etched with, for example, reactive ion etching to remove the opaque mask material where desired. If the spacers 30 are not desired, the etch process may be more isotropic. After the opaque mask material is etched, the resist is removed and the border 24, alignment marks 26, and wider pattern features 28 are formed to complete the alternating phase shift mask 22.

Figure 5C:
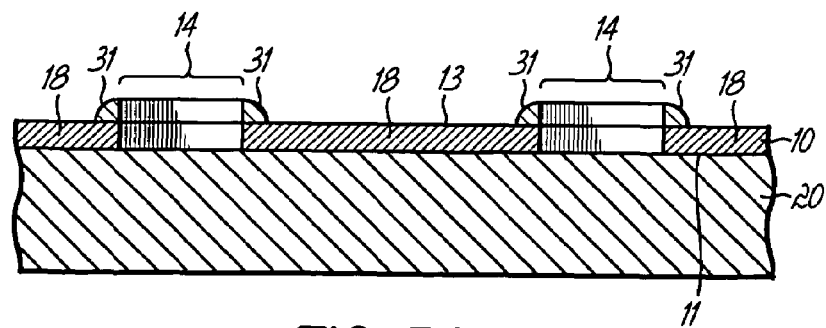
FIG. 5C is a cross-sectional view similar to FIG. 5B of an alternative embodiment of the invention.

With reference to FIG. 5B, opaque mask features or spacers 30 may be formed by blanket deposition of an opaque mask material over the patterned mask material layer 10, followed by anisotropic reactive ion etching (RIE) to leave opaque spacers 30. Typically, the opaque mask material is constituted by a layer of chrome approximately 30 nm to 80 nm thick. FIG. 5C depicts an alternative embodiment of the invention in which spacers 31 are provided as rings on the surface of the patterned mask material layer 10 by a standard lithographic and subtractive etch process.

In another embodiment of the invention, after the patterned mask material layer 10 is bonded to the mask blank 20, a narrow band of opaque mask material, typically about 2 to 20 mm, is deposited around the perimeter of the patterned area containing the phase shift windows 14 to define border 24, but not within the perimeter. Resist is applied over the narrow band and patterned with a conventional mask writing lithographic process to define alignment marks 26 in the opaque mask material and to trim the border 24, if desired. In this embodiment, the wider pattern features 28 and sidewall spacers 30 are omitted from the phase shift mask 22.

In use, the alternating phase shift mask 22 is mounted in a conventional optical lithography system and used to expose, as understood by persons of ordinary skill in the art, a radiation-sensitive photoresist covering a wafer or other substrate. Electromagnetic radiation projected from a light source of the optical lithography system and transmitted through the recessed phase shift windows 14 is shifted in phase by 180° or half-wavelength relative to electromagnetic radiation transmitted by non-phase shift windows 18. The electromagnetic radiation from neighboring windows 14 and 18 destructively interferes where their edges overlap at the plane of the wafer, which defines unexposed or underexposed latent features in the photoresist. The opaque mask features 24, 26, 28, 30 define areas that permit no transmission of electromagnetic radiation for forming conventional features, such as border 24, alignment marks 26, wider pattern features 28 inappropriate for formation by phase shifted electromagnetic radiation, and sidewall spacers 30, 32.

Figure 6A:
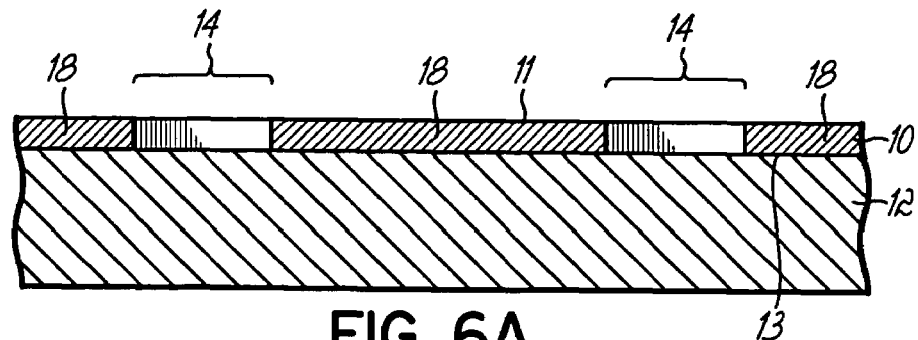
FIGS. 6A-F are cross-sectional views of a portion of a substrate at various stages of a processing method in accordance with an embodiment of the invention.
Figure 6B:
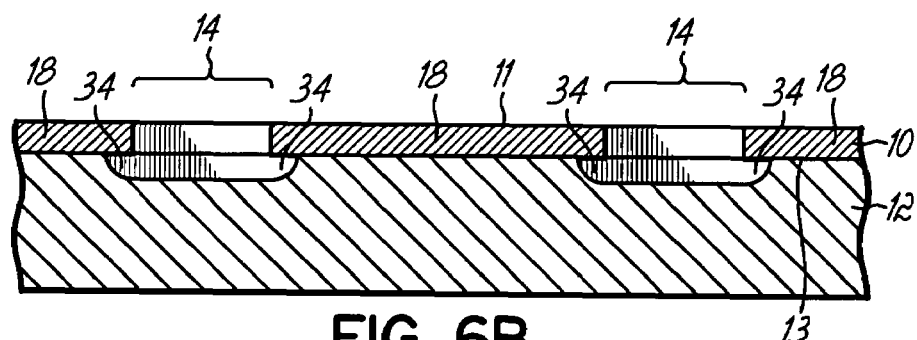

With reference to FIGS. 6A-6E in which like reference numerals refer to like features in FIGS. 1-5 and in accordance with an alternative embodiment of the invention, opaque mask features 32 having the form of spacers may be formed by undercutting the handle wafer 12, using the phase shift windows 14 as self-aligning etch guides. FIG. 6A shows the structure of FIG. 2C after the resist layer 16 is stripped from surface 11 of the phase shift mask 10. FIG. 6B shows the results of isotropically etching handle substrate 12 using a wet etchant solution that is selective to mask material layer 10. Isotropic etching creates undercut regions 34 extending laterally in substrate 12 beneath the opposed edges of the non-phase shift windows 18. If handle substrate 12 is a silicon wafer and layer 10 is comprised of silicon dioxide, then aqueous potassium hydroxide (KOH) is an appropriate etch solution for providing the undercut regions 34. An undercut (i.e., etch) depth of 30 nanometers to 80 nanometers is suitable.

Figure 6C:
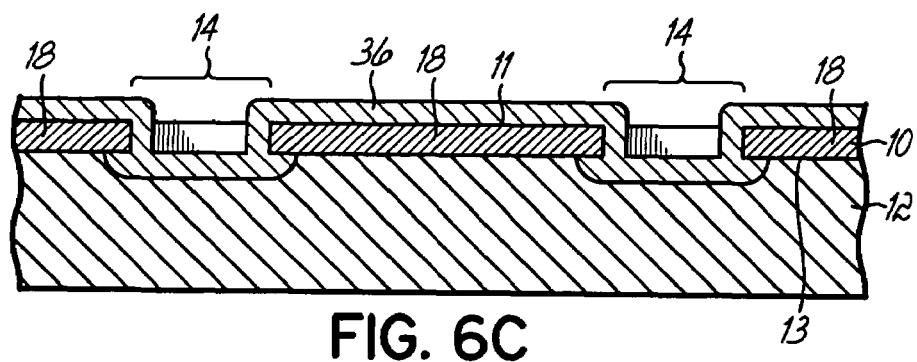
Figure 6D:
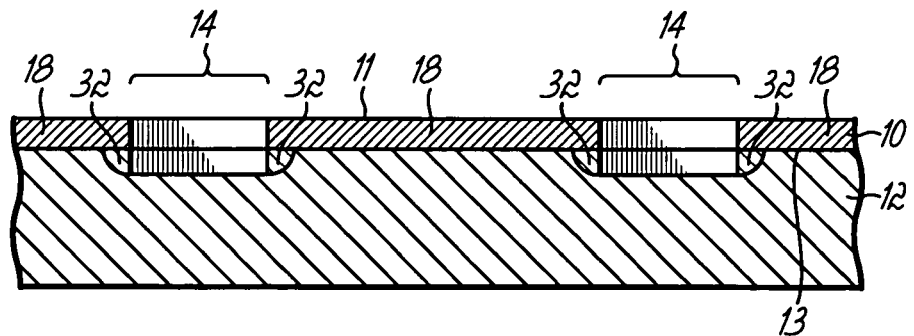
Figure 6E:
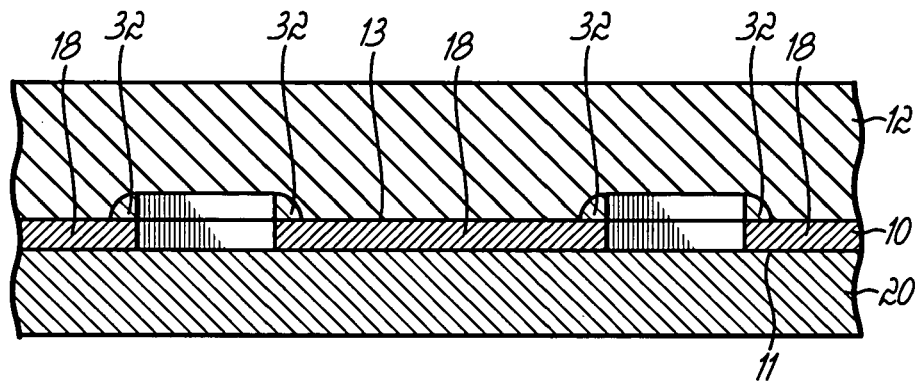
Figure 6F:
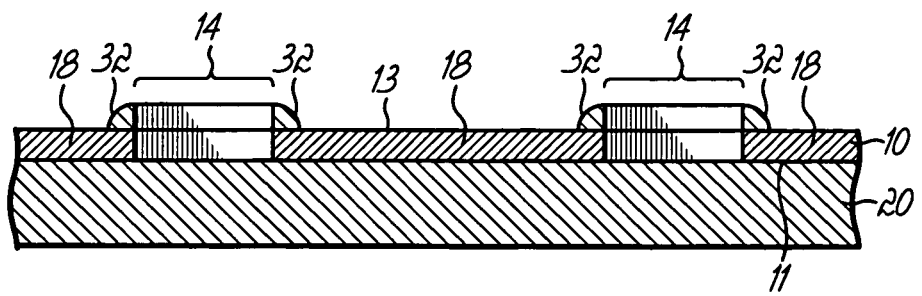

With reference to FIG. 6C, a conformal thin film 36 of an opaque material is deposited to a thickness adequate for filling the undercut regions 32. With reference to FIG. 6C, an anisotropic etch selective to at least the mask material layer 10 is performed to remove portions of layer 36 to leave behind spacers 32 that fill the undercut regions 34 and which are self-aligned to phase shift windows 14. With reference to FIGS. 6D and 6E, the handle substrate 12, containing the patterned masking film 10 and opaque features or spacers 32, is then bonded to the mask blank 20, and then the handle substrate 12 is removed, as shown in FIG. 6F, using methods as described above.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating an alternating phase shift mask, comprising:
    forming a layer of a phase shift mask material on a handle substrate;
    patterning the layer to form a plurality of phase shift windows in the phase shift mask material; and
    transferring the patterned layer from the handle substrate to a mask blank to construct the alternating phase shift mask.

2. The method of claim 1 wherein a thickness of the layer and an index of refraction of the phase shift mask material are selected to provide a phase shift of approximately 180° for electromagnetic radiation transmitted through the plurality of phase shift windows relative to electromagnetic radiation transmitted through regions of the phase shift mask material between the plurality of phase shift windows.

3. The method of claim 1 further comprising:
    depositing an opaque material on the patterned layer; and
    patterning the opaque material to form an opaque feature.

4. The method of claim 3 wherein the opaque material is chromium.

5. The method of claim 3 wherein the opaque feature is selected from the group consisting of an exposure field border, alignment marks, wide pattern features, and sidewall spacers for the plurality of phase shift windows.

6. The method of claim 1 wherein forming the layer of the phase shift mask material further comprises:
    depositing the phase shift mask material on the handle substrate to form the layer.

7. The method of claim 1 wherein forming the layer further comprises:
    growing the phase shift mask material from a surface thickness of the handle substrate to form the layer.

8. The method of claim 7 wherein the handle substrate is silicon and the phase shift mask material is silicon oxide.

9. The method of claim 8 wherein growing the phase shift mask material comprises:
    thermally oxidizing the silicon handle wafer to grow silicon oxide.

10. The method of claim 1 wherein transferring the patterned layer comprises:
    etching the handle substrate until removed from the phase shift mask material without modifying a thickness of the layer.

11. The method of claim 10 wherein the handle substrate is silicon and the phase shift mask material is silicon oxide, and etching the handle substrate comprises:
    etching in an aqueous wet etchant solution containing potassium hydroxide.

12. The method of claim 1 wherein patterning the layer comprises:
    removing portions of the phase shift mask material so that the plurality of phase shift windows extend completely through a thickness of the layer.

13. The method of claim 12 wherein the thickness of the layer and an index of refraction of the phase shift mask material are selected to provide a phase shift of approximately 180° for electromagnetic radiation traversing the plurality of phase shift windows.

14. The method of claim 1 wherein the mask blank is formed from quartz and the phase shift mask material is selected from the group consisting of quartz and silicon oxide.

15. The method of claim 1 wherein transferring the patterned layer comprises:
    contacting the patterned layer with the mask blank to establish a substantially planar interface;
    bonding the phase shift mask material to the mask blank at the interface; and
    removing the handle substrate from the patterned layer.

16. The method of claim 15 wherein bonding the layer to the mask blank comprises:
    heating the interface to a temperature effective to cause fusion bonding.

17. The method of claim 15 wherein removing the handle substrate comprises:
    etching the handle substrate selective to the phase shift mask material and the mask blank.

18. The method of claim 1 further comprising:
    reducing the area of the patterned layer before transferring the patterned layer from the handle substrate to the mask blank.

19. The method of claim 18 wherein reducing the area comprises:
    cleaving the patterned layer to reduce the area.

20. The method of claim 18 wherein reducing the area comprises:
    dicing the patterned layer to reduce the area.

21. The method of claim 18 wherein a thickness of the layer and an index of refraction of the phase shift mask material are selected over the reduced area to provide a phase shift of approximately 180° for electromagnetic radiation traversing the phase shift windows.

22. The method of claim 1 wherein patterning the layer comprises:
    etching the layer with an anisotropic etch process for a time sufficient to form the plurality of phase shift windows.

23. The method of claim 1 further comprising:
isotropically etching the handle substrate selective to the phase shift mask material using the plurality of phase shift windows as a mask to form undercut regions in the handle substrate extending beneath each of the plurality of phase shift windows.

24. The method of claim 23 further comprising:
filling the undercut regions in the handle substrate with an opaque material to form a plurality of spacers each proximate to a perimeter of a corresponding one of the plurality of phase shift windows.

25. The method of claim 24 wherein filling the undercut regions comprises:
depositing a conformal film of the opaque material over the patterned layer; and
removing the conformal film with the exception of the opaque material present in the undercut regions.

26. The method of claim 23 wherein etching the handle substrate comprises:
etching in an aqueous wet etchant solution containing potassium hydroxide for a time sufficient to form the undercut regions.

27. An alternating phase shift mask produced by the process comprising:
forming a layer of a phase shift mask material on a handle substrate;
patterning the layer to form a plurality of phase shift windows in the phase shift mask material; and
transferring the patterned layer from the handle substrate to a mask blank to construct the alternating phase shift mask.

28. The alternating phase shift mask of claim 27 wherein a thickness of said layer and an index of refraction of said phase shift mask material are selected to provide a phase shift of approximately 180° for electromagnetic radiation traversing said plurality of phase shift windows.

29. The alternating phase shift mask of claim 27 further comprising:
an opaque feature of an opaque material on said patterned layer.

30. The alternating phase shift mask of claim 29 wherein said opaque material is chromium.

31. The alternating phase shift mask of claim 30 wherein the opaque feature is selected from the group consisting of an exposure field border, alignment marks, wide pattern features, and sidewall spacers for the plurality of phase shift windows.

32. The alternating phase shift mask of claim 27 wherein said phase shift mask material is deposited on said handle substrate to form said layer.

33. The alternating phase shift mask of claim 27 wherein said phase shift mask material is grown on said handle substrate to form said layer.

34. The alternating phase shift mask of claim 33 wherein said handle substrate is silicon and said phase shift mask material is silicon oxide grown by oxidizing said handle substrate.

35. The alternating phase shift mask of claim 27 wherein said mask blank is formed from quartz and said phase shift mask material is selected from the group consisting of quartz and silicon oxide.

36. The alternating phase shift mask of claim 27 wherein said mask blank is substantially optically transparent and said phase shift mask material is substantially optically transparent.

37. A structure for forming an alternating phase shift mask comprising:
a handle substrate;
a mask blank; and
a layer of a phase shift mask material disposed between said handle substrate and said mask blank, said layer including a plurality of phase shift windows extending through said phase shift mask material, and said layer characterized by a thickness and said phase shift mask material characterized by an index of refraction selected to provide a phase shift of approximately 180° for electromagnetic radiation traversing said plurality of phase shift windows.

38. The alternating phase shift mask of claim 37 wherein said phase shift mask material is deposited on said handle substrate to form said layer.

39. The alternating phase shift mask of claim 37 wherein said phase shift mask material is grown on said handle substrate to form said layer.

40. The alternating phase shift mask of claim 39 wherein said handle substrate is silicon and said phase shift mask material is silicon oxide grown by oxidizing said handle substrate.

41. The alternating phase shift mask of claim 37 wherein said mask blank is formed from quartz and said phase shift mask material is selected from the group consisting of quartz and silicon oxide.

42. The alternating phase shift mask of claim 37 wherein said mask blank is substantially optically transparent and said phase shift mask material is substantially optically transparent.

43. An alternating phase shift mask comprising:
a mask blank having a first surface;
a layer of a phase shift mask material disposed on said mask blank, said layer including a second surface confronting said first surface and a plurality of phase shift windows extending through said phase shift mask material, said layer characterized by a thickness and said phase shift mask material characterized by an index of refraction selected to provide a phase shift of approximately 180° for electromagnetic radiation traversing said plurality of phase shift windows; and
a fused interface joining said first surface of said mask blank with said second surface of said layer.

44. The alternating phase shift mask of claim 43 wherein said mask blank is formed from quartz and said phase shift mask material is selected from the group consisting of quartz and silicon oxide.

45. The alternating phase shift mask of claim 43 wherein said mask blank is substantially optically transparent and said phase shift mask material is substantially optically transparent.

46. The alternating phase shift mask of claim 43 further comprising:
an opaque feature of an opaque material on said patterned layer.

47. The alternating phase shift mask of claim 46 wherein said opaque material is chromium.

48. The alternating phase shift mask of claim 46 wherein the opaque feature is selected from the group consisting of an exposure field border, alignment marks, wide pattern features, and sidewall spacers for the plurality of phase shift windows.

* * * * *